US009335628B2

(12) United States Patent
Kodama

(10) Patent No.: US 9,335,628 B2
(45) Date of Patent: May 10, 2016

(54) CURABLE COMPOSITION FOR IMPRINTS, PATTERNING METHOD AND PATTERN

(75) Inventor: Kunihiko Kodama, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 668 days.

(21) Appl. No.: 13/499,282

(22) PCT Filed: Sep. 29, 2010

(86) PCT No.: PCT/JP2010/067491
§ 371 (c)(1),
(2), (4) Date: Mar. 29, 2012

(87) PCT Pub. No.: WO2011/040635
PCT Pub. Date: Apr. 7, 2011

(65) Prior Publication Data
US 2012/0183752 A1 Jul. 19, 2012

(30) Foreign Application Priority Data
Sep. 30, 2009 (JP) ................ 2009-226699

(51) Int. Cl.
G03F 7/00 (2006.01)
B82Y 10/00 (2011.01)
B82Y 40/00 (2011.01)
C08F 220/18 (2006.01)
C08F 220/22 (2006.01)
C08F 220/24 (2006.01)
C08F 220/26 (2006.01)
C08F 220/42 (2006.01)
G03F 7/004 (2006.01)
G03F 7/027 (2006.01)
G03F 7/038 (2006.01)
G03F 7/075 (2006.01)

(52) U.S. Cl.
CPC ............. *G03F 7/0002* (2013.01); *B82Y 10/00* (2013.01); *B82Y 40/00* (2013.01); *C08F 220/18* (2013.01); *C08F 220/22* (2013.01); *C08F 220/24* (2013.01); *C08F 220/26* (2013.01); *C08F 220/42* (2013.01); *G03F 7/0046* (2013.01); *G03F 7/027* (2013.01); *G03F 7/038* (2013.01); *G03F 7/0388* (2013.01); *G03F 7/0751* (2013.01); *G03F 7/0755* (2013.01); *Y10T 428/24802* (2015.01)

(58) Field of Classification Search
CPC ................ Y10T 428/24802; Y10T 428/3154; Y10T 428/31544
USPC .............. 428/64.1, 195.1; 526/242, 245, 246, 526/279
See application file for complete search history.

(56) References Cited

U.S. PATENT DOCUMENTS

| 5,032,108 | A | 7/1991 | Taniguchi et al. | |
|---|---|---|---|---|
| 5,128,389 | A * | 7/1992 | Inukai et al. | 522/172 |
| 5,169,965 | A | 12/1992 | Fujiwa et al. | |
| 5,198,509 | A | 3/1993 | Fujiwa et al. | |
| 5,259,926 | A | 11/1993 | Kuwabara et al. | |
| 5,338,879 | A | 8/1994 | Fujiwa et al. | |
| 5,378,736 | A | 1/1995 | Fujiwa et al. | |
| 5,772,905 | A | 6/1998 | Chou | |
| 5,956,216 | A | 9/1999 | Chou | |
| 7,198,968 | B2 | 4/2007 | Chae et al. | |
| 7,821,586 | B2 | 10/2010 | Kim | |
| 7,883,764 | B2 | 2/2011 | Murao | |
| 8,282,872 | B2 * | 10/2012 | Fujita et al. | 264/446 |
| 2005/0142714 | A1 | 6/2005 | Chae et al. | |
| 2005/0231669 | A1 | 10/2005 | Kim | |
| 2008/0167396 | A1 | 7/2008 | Murao | |
| 2011/0311826 | A1 * | 12/2011 | Qiu et al. | 428/412 |

FOREIGN PATENT DOCUMENTS

| JP | 2906245 B2 | 6/1990 |
|---|---|---|
| JP | 11-100378 A | 4/1999 |
| JP | 2926262 B2 | 7/1999 |
| JP | 2004-240241 A | 8/2004 |
| JP | 2005-197699 A | 7/2005 |
| JP | 2005-301289 A | 10/2005 |
| JP | 2006-114882 A | 4/2006 |
| JP | 2008-095037 A | 4/2008 |
| JP | 2008-105414 A | 5/2008 |
| JP | 2008-168480 A | 7/2008 |
| JP | 2009-206197 A | 9/2009 |
| JP | 2009-215179 A | 9/2009 |
| WO | 2005/082992 A1 | 9/2005 |
| WO | WO 2009110496 A1 * | 9/2009 |

OTHER PUBLICATIONS

International Preliminary Report on Patentability mailed Apr. 12, 2012 for International Application No. PCT/JP2010/067491.
Office Action dated Feb. 25, 2014 in Japanese Application No. 2010-216400 Partial English translation.
Stephen Y. Chou et al., "Imprint of sub-25 nm vias and trenches in polymers", Appl. Phys. Lett., Nov. 20, 1995, pp. 3114-3116, vol. 67, No. 21.
Alfred Hassner, ed., "The Chemistry of Heterocyclic Compounds—Small Ring Heterocycles, Oxiranes, Arene Oxides, Oxaziridines, Dioxetanes, Thietanes, Thietes, Thiazetes, and Others", Part 3, Chemistry of Heterocyclic Compounds, John Wiley and Sons, an Interscience Publication, New York, 1985.
M. Colburn et al., "Step and Flash Imprint Lithography: A New Approach to High-Resolution Patterning", Proc. SPIE, SPIE Conference on Emerging Lithographic Technologies III, Mar. 1999, pp. 379-389, vol. 3676.
Stephen C. Lapin, "Vinyl Ether Functionalized Urethane Oligomers: An Alternative to Acrylate Based Systems", Polymers Paint Colour Journal, May 17, 1989, pp. 321-328, vol. 179, No. 4237.
Office Action dated Jan. 21, 2016, issued by the Korean Intellectual Property Office in corresponding Korean Application No. 10-2012-7009292.

* cited by examiner

*Primary Examiner* — Gerard Higgins
(74) *Attorney, Agent, or Firm* — Sughrue Mion, PLLC

(57) ABSTRACT

A curable composition for imprints which comprises a polymerizable compound having at least one of a fluorine atom and a silicon atom, a photopolymerization initiator, and a compound having a functional group capable of bonding to a substrate exhibits good patternability in transferring patterns, particularly micropatterns.

19 Claims, No Drawings

CURABLE COMPOSITION FOR IMPRINTS, PATTERNING METHOD AND PATTERN

CROSS REFERENCE TO RELATED APPLICATIONS

This application is a National Stage of International Application No. PCT/JP2010/067491 filed Sep. 29, 2010, claiming priority based on Japanese Patent Application No. 2009-226699 filed Sep. 30, 2009, the contents of all of which are incorporated herein by reference in their entirety.

TECHNICAL FIELD

The present invention relates to a curable composition for imprints. More precisely, the invention relates to a curable composition for micropatterning to give imprints through photoirradiation, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

BACKGROUND ART

Imprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of imprint technology have been proposed; one is a thermal imprint method using a thermoplastic resin as the material to be worked (for example, see S. Chou, et al., Appl. Phys. Lett. Vol. 67, 3114 (1995)), and the other is a photoimprint method using a photocurable composition (for example, see M. Colbun, et al., Proc. SPIE, Vol. 3676, 379 (1999)). In the thermal imprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose an imprint method of forming nanopatterns inexpensively.

On the other hand, in the photoimprint method where a composition for photoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the imprint methods as above, proposed are applied technologies to nano-scale mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned imprint technologies and their applied technologies has become active for practical use thereof.

As one example of imprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, imprint lithography, particularly nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of imprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of imprint technology is proposed. The application also requires micropatternability on a level of a few tens nm and high-level etching resistance of the micropattern functioning as a mask in substrate processing.

Next described is an application example of imprint technology to flat displays such as liquid-crystal displays (LCD) and plasma display panels (PDP).

With the recent tendency toward large-sized LCD substrates and PDP substrates for high-definition microprocessing thereon, photoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 µm or 20 µm or so is formed through photolithography, and this is further thermally cured through past-baking to form the intended spacer.

Further, imprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in imprint technology, which is therefore specifically noted as a technology capable of forming micropatterns inexpensively.

In industrial use of nanoimprinting, it is important to repeatedly and stably form a good pattern. In particular, especially for large-scale mass-production, yield increase is required in continuous patterning, or that is, good patternability is required in repeated pattern transferring. On the other hand, from the viewpoint of improving optical properties in nanopatterning or improving the etching resistance in substrate processing, formation of patterns is desired, of which the aspect ratio indicating the ratio of the line depth to the line width of the pattern, is high.

JP-A 2006-114882 and 2008-95037 disclose use of a photocurable composition that contains a fluoromonomer but does not contain a silane coupling agent, in nanoimprinting, saying that the composition has good patternability at an aspect ratio of around from 0.2 to 0.25, or around 2, respectively.

WO2005/82992 discloses use of a photocurable composition that contains a silicon-containing monomer but does not contain a silane coupling agent, in nanoimprinting; however, this describes neither the preferred range of the aspect ratio of the formed pattern nor the patterning accuracy.

JP-A 2008-105414 discloses use of a photocurable composition containing a silicone surfactant in nanoimprinting, saying that the composition has good patternability at an aspect ratio of 0.5 or so; however, in this, nothing is investigated relating to the patternability of the composition combined with a silicon-containing monomer.

As in the above, at present, nothing is investigated in any reference, relating to the patternability in transferring patterns having a high aspect ratio or in repeated pattern transferring.

SUMMARY OF THE INVENTION

The present inventors tried and investigated the photocurable compositions described in JP-A 2006-114882, 2008-95037, WO2005/82992 and JP-A 2008-105414 for the patternability thereof in transferring patterns having a high aspect ratio or in repeated pattern transferring. As a result, the inventors have known that, in using the photocurable compositions described in these references for forming patterns having a high aspect ratio or for forming patterns repeatedly, the patternability of the compositions is not on a satisfactory level, and have further known that, in using the compositions for transferring patterns having a high aspect ratio in a mode of repeated pattern transferring, there occurs a problem in that the patternability of the compositions is greatly worsened.

An object of the invention is to solve the above-mentioned problems. Specifically, the problems that the invention is to solve are to provide a curable composition for nanoimprints that exhibits good patternability in transferring high-aspect patterns or in repeated pattern transferring or further in repeatedly transferring high-aspect patterns, to provide a patterning method that uses it, and to provide the pattern formed according to the patterning method.

Given the situation as above, the inventors have assiduously studied and, as a result, have found that the above-mentioned problems can be solved by the following means:

[1] A curable composition for imprints, comprising (A1) a polymerizable compound having at least one of a fluorine atom and a silicon atom (except the compound (C) mentioned below that has a functional group capable of bonding to a substrate), (B) a photopolymerization initiator and (C) a compound having a functional group capable of bonding to a substrate.

[2] The curable composition for imprints of [1], further comprising (A2) any other polymerizable compound than the polymerizable compound (A1) having at least one of a fluorine atom and a silicon atom.

[3] The curable composition for imprints of [2], wherein the compound (C) having a functional group capable of bonding to a substrate further has a functional group capable of reacting with the polymerizable compound (A1) having at least one of a fluorine atom and a silicon atom or a functional group capable of reacting with the other polymerizable compound (A2).

[4] The curable composition for imprints of [2] or [3], wherein at least one polymerizable compound of the polymerizable compound (A1) having at least one of a fluorine atom and a silicon atom and the other polymerizable compound (A2) has a (meth)acrylate group.

[5] The curable composition for imprints of any one of [1] to [4], wherein the polymerizable compound (A1) having at least one of a fluorine atom and a silicon atom is a polymerizable non-polymer compound having a fluorine atom and having a fluorine content of from 30 to 60%.

[6] The curable composition for imprints of any one of [1] to [5], wherein the polymerizable compound (A1) having at least one of a fluorine atom and a silicon atom is a polymerizable polymer compound having a fluorine atom and having a fluorine content of from 10 to 50%.

[7] The curable composition for imprints according to any one of [1] to [6], wherein the polymerizable compound (A1) having at least one of a fluorine atom and a silicon atom is a polymerizable compound having at least one of a perfluoroalkyl group and a perfluoroalkylene group.

[8] The curable composition for imprints according to any one of [1] to [7], wherein the polymerizable compound (A1) having at least one of a fluorine atom and a silicon atom is a polymerizable compound has two or more fluorine-having groups in the molecule.

[9] The curable composition for imprints according to anyone of [1] to [8], wherein the polymerizable compound (A1) having at least one of a fluorine atom and a silicon atom is a polymerizable compound having at least one of a trialkylsilyl group, a linear siloxane structure, acyclic siloxane structure, and a caged siloxane structure.

[10] The curable composition for imprints of any one of [1] to [9], wherein the compound (C) having a functional group capable of bonding to a substrate has a silicon atom-having group as the functional group capable of bonding to a substrate.

[11] The curable composition for imprints of [10], wherein the compound (C) having a functional group capable of bonding to a substrate is a silane coupling agent having a carbon-carbon unsaturated bond and a nitrogen atom.

[12] The curable composition for imprints of [11], wherein the compound (C) having a functional group capable of bonding to a substrate is a silane coupling agent having a carbon-carbon unsaturated bond and an amino group.

[13] The curable composition for imprints of any one of [1] to [12], wherein the substrate is a silicon substrate or a glass substrate.

[14] A patterning method comprising applying the curable composition for imprints of any one of [1] to [13] onto a substrate to form a patterning layer thereon, pressing a mold against the surface of the patterning layer, and irradiating the patterning layer with light.

[15] A pattern formed according to the patterning method of [14].

The invention provides a curable composition for imprints which exhibits good patternability in transferring high-aspect patterns or in repeated pattern transferring or further in repeatedly transferring high-aspect patterns, and the curable composition for imprints of the invention is usable as a curable composition for nanoimprints.

MODES FOR CARRYING OUT THE INVENTION

The contents of the invention are described in detail hereinunder. In this specification, the numerical range expressed by the wording "a number to another number" means the range that falls between the former number indicating the lowermost limit of the range and the latter number indicating the uppermost limit thereof. In this specification, mass ratio is equal to weight ratio.

In this description, "(meth)acrylate" means acrylate and methacrylate; "(meth)acrylic" means acrylic and methacrylic; "(meth)acryloyl" means acryloyl and methacryloyl. In the invention, "monomer" is differentiated from oligomer and polymer, and the monomer indicates a compound having a weight-average molecular weight of at most 1,000. In this description, "polymerizable compound" means a compound having a polymerizable functional group, concretely, a compound having a group that participates in polymerization. "Imprint" referred to in the invention is meant to indicate pattern transfer in a size of from 1 nm to 10 mm, more preferably pattern transfer in a size of approximately from 10 nm to 100 μm (for nanoimprints).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Imprints of the Invention]

The curable composition for imprints of the invention (hereinafter this may be simply referred to as "the curable composition of the invention" or "the composition of the invention") comprises (A1) a polymerizable compound having at least one of a fluorine atom and a silicon atom (except the compound (C) mentioned below that has a functional group capable of bonding to a substrate), (B) a photopolymerization initiator and (C) a compound having a functional group capable of bonding to a substrate.

<(A) Polymerizable Compound>

The curable composition for imprints of the invention contains, as a polymerizable compound (A), the polymerizable compound (A1) having at least one of a fluorine atom and a silicon atom (except the compound (C) mentioned below that has a functional group capable of bonding to a substrate). The polymerizable compound (A) may further contain any other polymerizable compound (A2).

The polymerizable functional group that the polymerizable compound (A) has includes a radical polymerizable functional group such as a (meth)acrylate group, a (meth)acrylamide group, a vinyl group, an allyl group, etc.; a cationic polymerizable functional group such as an epoxy group, an oxetanyl group, a vinyl ether group, etc. Preferred is a radical polymerizable functional group, and more preferred is a (meth)acrylate group.

The polymerizable compound (A1) having at least one of a fluorine atom and a silicon atom and the other polymerizable compound (A2) are described below.

((A1) Polymerizable Compound Having at Least One of Fluorine Atom and Silicon Atom)

The polymerizable compound (A1) having at least one of a fluorine atom and a silicon atom is a compound that has at least one functional group having a fluorine atom or a silicon atom or both of a fluorine atom and a silicon atom and has at least one polymerizable functional group (except the compound (C) mentioned below that has a functional group capable of bonding to a substrate).

The polymerizable compound (A1) having at least one of a fluorine atom and a silicon atom may be a low-molecular compound or a polymer.

In case where the polymerizable compound (A1) having at least one of a fluorine atom and a silicon atom is a polymer, it may has a recurring unit having at least any one of a fluorine atom or a silicon atom, and a recurring unit having a polymerizable group in the side chain thereof as a copolymerizable component. The recurring unit having at least any one of a fluorine atom or a silicon atom may have a polymerizable group in the side chain thereof, especially at the terminal thereof. In this case, the skeleton of the recurring unit having at least one of a fluorine atom or a silicon atom is not specifically defined so far as it is not contradictory to the scope and the spirit of the invention, but preferably has a skeleton derived from an ethylenic unsaturated bond-having group, and more preferred is an embodiment having a (meth)acrylate skeleton. The silicon atom-having recurring unit may be such that the silicon atom itself forms a recurring unit, for example, as in a dimethylsiloxane structure.

Not specifically defined, the content of (A1) in the curable composition for imprints of the invention is preferably from 0.1 to 100% by mass of all the polymerizable compounds, from the viewpoint of improving the curability of the composition and the viscosity thereof, more preferably from 0.2 to 50% by mass, even more preferably from 0.5 to 20% by mass, still more preferably from 1 to 10% by mass.

(1) Fluorine Atom-Having Polymerizable Compound:

The group that contains the fluorine atom in the fluorine atom-having polymerizable compound is preferably a fluorine atom-having group selected from a fluoroalkyl group and a fluoroalkyl ether group. More preferably, the fluorine atom-having polymerizable compound has at least one of a perfluoroalkyl group and a perfluoroalkylene group.

The fluoroalkyl group is preferably a fluoroalkyl group having at least 2 carbon atoms, more preferably a fluoroalkyl group having at least 4 carbon atoms. Not specifically defined, the uppermost limit of the number of the carbon atoms of the group is at most 20, more preferably at most 8, even more preferably at most 6; and most preferred is a fluoroalkyl group having from 4 to 6 carbon atoms. Preferred examples of the fluoroalkyl group include a trifluoromethyl group, a pentafluoroethyl group, a heptafluoropropyl group, a hexafluoroisopropyl group, a nonafluorobutyl group, a tridecafluorohexyl group, a heptadecafluorooctyl group.

Preferably, the polymerizable compound (A1) having at least one of a fluorine atom and a silicon atom is a fluorine atom-having polymerizable compound that has a trifluoromethyl group. Specifically, at least one of the fluoroalkyl group in the compound preferably has a trifluoromethyl group structure. Having a trifluoromethyl group structure, the compound may exhibit the effect of the invention even though its amount added to the composition is small (for example, at most 10% by mass), and therefore, the miscibility of the compound with the other ingredients is high and the line edge roughness after dry etching the composition may be thereby reduced.

Like the fluoroalkyl group, the fluoroalkyl ether is preferably one having a trifluoromethyl group, and is preferably one having a perfluoroethyleneoxy group or a perfluoropropyleneoxy group. Also preferred is one having a trifluoromethyl group at the terminal of a fluoroalkyl ether unit and/or a fluoroalkyl ether group having a trifluoromethyl group such as —(CF(CF$_3$)CF$_2$O)— or the like.

The number of all the fluorine atoms that the fluorine atom-having polymerizable group has is, in case where the compound is a non-polymer compound, preferably from 3 to 60, more preferably from 5 to 40, even more preferably from 9 to 26.

Preferably, in case where it is a non-polymer compound, the fluorine atom-having polymerizable compound preferably has a fluorine content, as defined below, of from 30 to 60%, more preferably from 35 to 55%, even more preferably from 35 to 50%. In case where the fluorine atom-having polymerizable compound is a polymer compound, the fluorine content thereof, as defined below, is preferably from 10 to 50%, more preferably from 15 to 40%, even more preferably from 20 to 30%. Having the fluorine content that falls within the preferred range, the compound is effective for preventing molds from getting dirty and its compatibility with the other ingredients is good; and therefore the line edge roughness after dry etching the composition can be reduced and the effect of the invention that secures high-aspect patternability and repeated patternability is enhanced. In this description, the fluorine content is defined by the following formula:

Fluorine Content=[(number of fluorine atoms in polymerizable compound)×(atomic weight of fluorine atom)/(molecular weight of polymerizable compound)]×100.

One preferred example of the fluorine atom-having polymerizable compound is a compound having a partial structure of the following formula (I):

—CH$_2$CH$_2$—C$_n$F$_{2n+1}$ (I)

In formula (I), n indicates an integer of from 1 to 8, preferably an integer of from 4 to 6.

Another preferred example of the fluorine atom-having polymerizable compound is a compound having a partial structure of the following formula (II). Needless-to-say, the compound may have both the partial structure of formula (I) and the partial structure of formula (II).

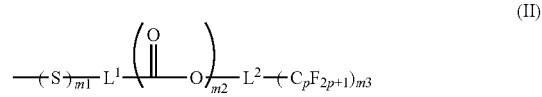

(II)

In formula (II), L$^1$ represents a single bond, or an alkylene group having from 1 to 8 carbon atoms; L$^2$ represents a linking group, preferably an alkylene group having from 1 to 8 carbon atoms; m1 and m2 each indicate 0 or 1, and at least one of m1 and m2 is 1; m3 indicates an integer of from 1 to 3; p indicates an integer of from 1 to 8; when m3 is 2 or more, (—C$_p$F$_{2p+1}$)'s may be the same or different.

L$^1$ and L$^2$ each are preferably an alkylene group having from 1 to 4 carbon atoms. Not overstepping the spirit and the scope of the invention, the alkylene group may have a substituent. m3 is preferably 1 or 2. p is preferably an integer of from 4 to 6.

A polymerizable compound having two or more fluorine-having groups (for example fluoroalkyl group and fluoroalkyl ether group) in the molecule can be particularly preferably used as the fluorine atom-having polymerizable compound. The polymerizable compound having two or more fluorine-having groups exhibits the effect of the invention even though its amount added to the composition is small. Additionally, mold filling capability is improved and the line edge roughness after dry etching the composition can be reduced. The number of the fluorine-having group in the molecule is preferably from 2 to 4, more preferably 2 or 3, still more preferably 2.

The polymerizable compound having two or more fluoroalkyl groups or fluoroalkyl ether groups in the molecule is preferably a polymerizable monomer represented by the following formula (III):

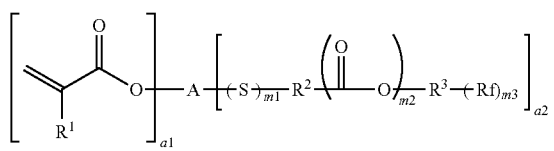

(III)

In formula (III), $R^1$ represents a hydrogen atom, an alkyl group, a halogen atom or a cyano group, preferably a hydrogen atom or an alkyl group, more preferably a hydrogen atom or a methyl group, still more preferably a hydrogen atom.

A represents a (a1+a2)-valent linking group, preferably a group having at least one of an alkylene group and an arylene group. A may contain a linking group having a hetero atom, which includes —O—, —C(=O)O—, —S— and —C(=O)—. These groups may have a substituent so far as it is not contradictory to the scope and the spirit of the invention, but no substituent is preferable. The carbon number of A is preferably from 2 to 5, more preferably from 4 to 15.

a1 indicates an integer of from 1 to 6, preferably an integer of from 1 to 3, more preferably 1 or 2.

a2 indicates an integer of from 2 to 6, preferably 2 or 3, more preferably 3.

$R^2$ represents a single bond or an alkylene group having from 1 to 8 carbon atoms.

$R^3$ represents a linking group, preferably a single bond or an alkylene group having from 1 to 8 carbon atoms.

Rf represents a fluoroalkyl group or a fluoroalkyl ether group, preferably a fluoroalkyl group having from 1 to 8 carbon atoms or a fluoroalkyl ether group having from 3 to 20 carbon atoms.

m1 and m2 each independently indicate 0 or 1. m3 indicates an integer of from 1 to 3. When a1 is 2 or more, each $R^1$ may be the same or different. When a2 is 2 or more, each $R^2$, $R^3$, m1, m2 and m3 may be the same or different. When m3 is 2 or more, each Rf may be the same or different.

In the case where a polymer is used as the polymerizable compound having a fluorine-having group in the curable composition for imprints of the invention, it is preferably a polymer containing a recurring unit derived from the preferable polymerizable compound having a fluorine-having group described above.

The polymerizable compound (A1) having at least one of a fluorine atom and a silicon atom may be a fluorine atom-having polymer having a weight-average molecular weight of from 1000 to 100000. More preferably, the weight-average molecular weight of the fluorine atom-having polymer is from 2000 to 100000, even more preferably from 5000 to 50000. In this description, the weight-average molecular weight is measured through GPC in terms of standard polystyrene.

Specific examples of the fluorine atom-having polymerizable compound for use in the curable composition for imprints of the invention are described below, to which, however, the invention should not be limited.

The fluorine atom-having polymerizable compound includes fluorine atom-having monofunctional polymerizable compounds such as trifluoroethyl(meth)acrylate, pentafluoroethyl(meth)acrylate, (perfluorobutyl)ethyl(meth)acrylate, perfluorobutyl-hydroxypropyl(meth)acrylate, (perfluorohexyl)ethyl(meth)acrylate, octafluoropentyl(meth)acrylate, perfluorooctylethyl(meth)acrylate, tetrafluoropropyl(meth)acrylate, hexafluoropropyl(meth)acrylate, etc. As the fluorine atom-having polymerizable compound, also preferred are polyfunctional polymerizable compounds having two or more polymerizable functional groups and having a fluoroalkylene group and a di(meth)acrylate moiety, such as 2,2,3,3,4,4,-hexafluoropentane di(meth)acrylate, 2,2,3,3,4,4,5,5-octafluorohexane di(meth)acrylate, etc.

Preferable examples of the polymerizable compound having two or more fluoroalkyl groups or fluoroalkyl ether groups in the molecule includes the compounds having the following structures. In the structures, $R^1$ represents a hydrogen atom, an alkyl group, a halogen atom or a cyano group.

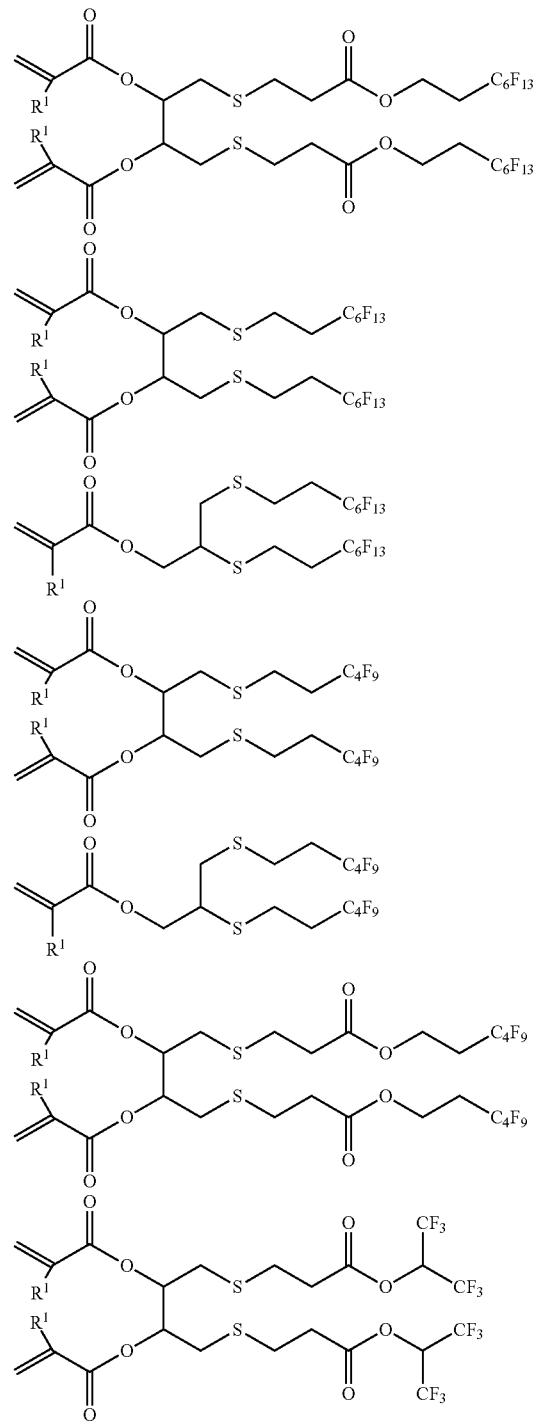

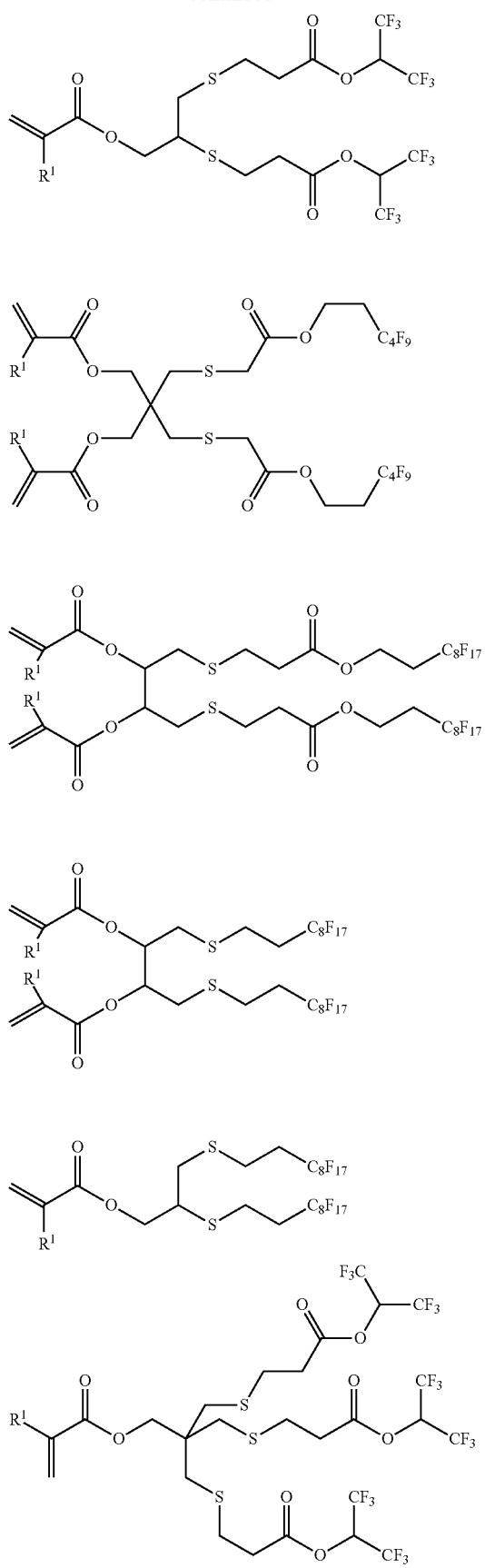
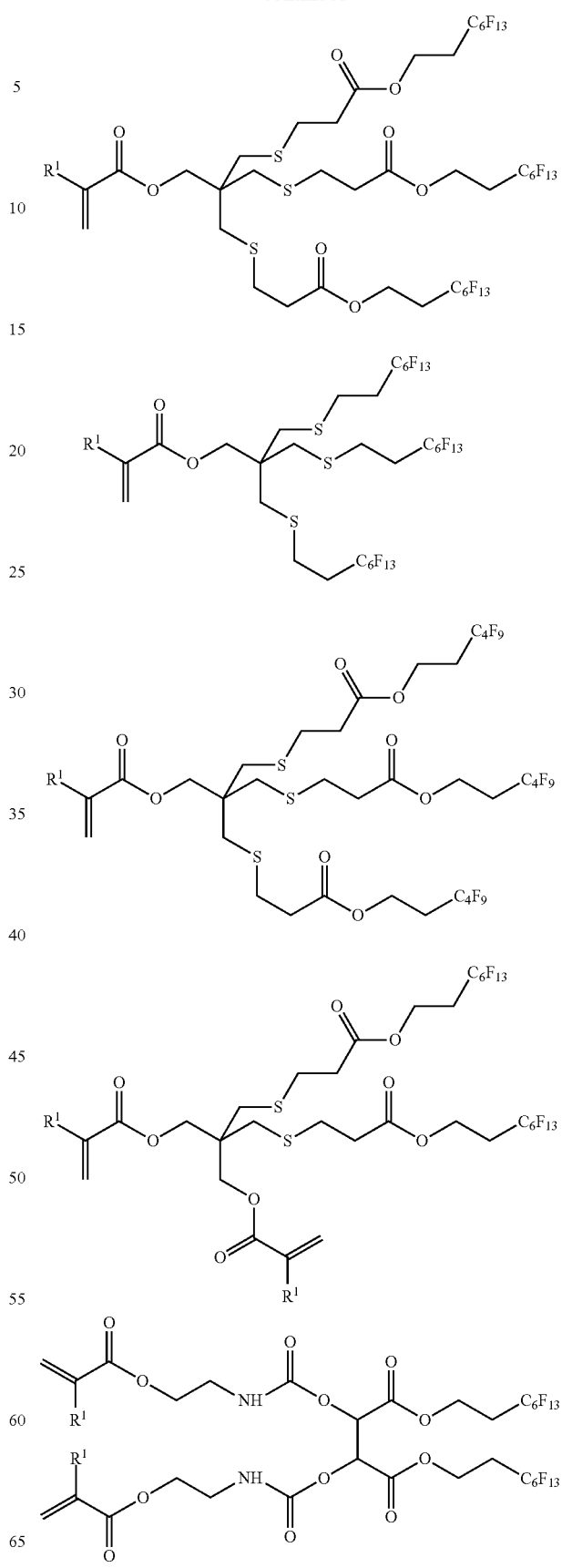

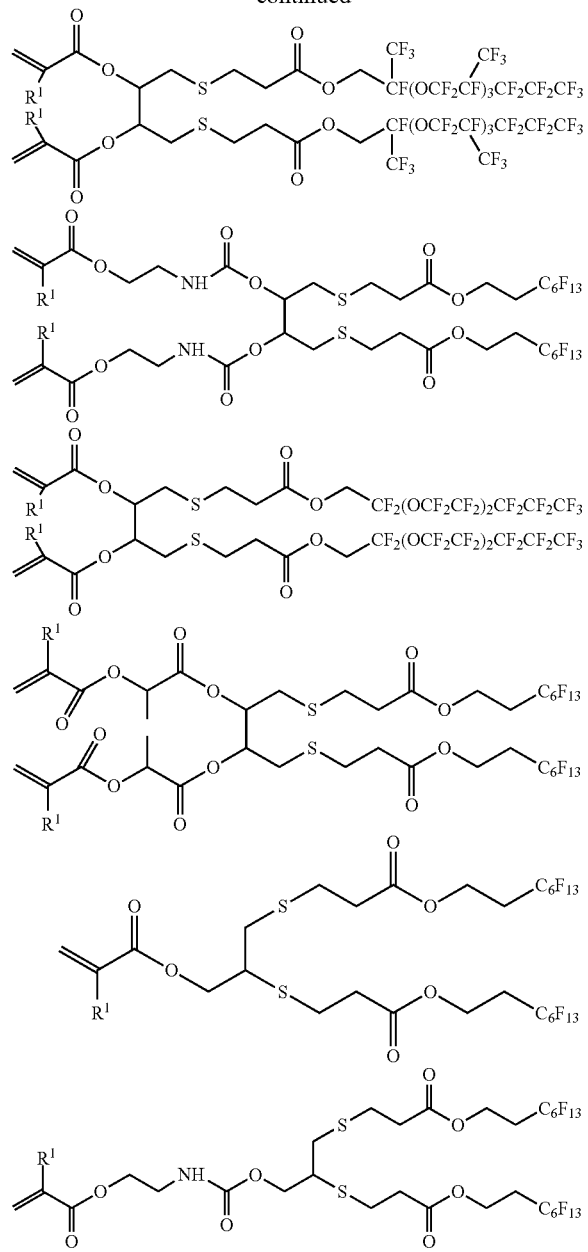

(2) Silicon Atom-Having Polymerizable Compound:

The silicon atom-having functional group does not include a functional group capable of bonding to a substrate that the ingredient (C) to be mentioned below has. In other words, in case where the silicon atom-having polymerizable compound contains a functional group capable of bonding to a substrate as the silicon atom-having functional group therein, then the compound is not within the range of the ingredient (A1) in the invention.

The structure of the silicon atom-having functional group includes a trialkylsilyl group, a linear siloxane structure, a cyclic siloxane structure, a caged siloxane structure, etc. Preferred is a functional group having a trimethylsilyl group or a dimethylsiloxane structure, from the viewpoint of the miscibility of the compound with other ingredients and the mold releasability of the composition.

Specific examples of the silicon atom-having polymerizable compound for use in the curable composition for imprints of the invention are shown below, to which, however, the invention should not be limited.

The silicon atom-having polymerizable compound includes 3-tris(trimethylsilyloxy)silylpropyl(meth)acrylate, trimethylsilylethyl(meth)acrylate, polydimethylsiloxane-substituted alkyl(meth)acrylate, polydimethylsiloxane structure-having di(meth)acrylate.

—Other Polymerizable Compound (A2)—

The curable composition of the invention may preferably contains other polymerizable compound (A2) as well as a polymerizable compound (A1) having at least one of a fluorine atom and a silicon atom from the viewpoint of improving the viscosity, the dry etching resistance, the imprint aptitude, the curability of the composition and so on.

The other polymerizable compounds (A2) which can be preferably used in the invention include, for example, a polymerizable unsaturated monomer having from 1 to 6 ethylenic unsaturated bond-having groups, a compound having an oxirane ring (epoxy compound), a vinyl ether compound, a styrene derivative, a fluorine atom-having compound, propenyl ether, butenyl ether, etc. From the viewpoint of the curability of the composition, more preferred is a polymerizable unsaturated monomer having from 1 to 6 ethylenic unsaturated bond-having groups.

The polymerizable unsaturated monomer having from 1 to 6 ethylenic unsaturated bond-having groups (mono- to hexa-functional polymerizable unsaturated monomer) is described below.

The polymerizable unsaturated monomer having one ethylenic unsaturated bond-having group (mono-functional polymerizable unsaturated monomer) includes concretely 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexylcarbitol(meth)acrylate, 2-hydroxybutyl(meth)acrylate, 2-hydroxyethyl(meth)acrylate, 2-hydroxypropyl(meth)acrylate, 2-methoxyethyl(meth)acrylate, 3-methoxybutyl(meth)acrylate, 4-hydroxybutyl(meth)acrylate, acrylic acid dimer, benzyl(meth)acrylate, 1- or 2-naphthyl(meta)acrylate, butanediol mono(meth)acrylate, butoxyethyl(meth)acrylate, butyl(meth)acrylate, cetyl(meth)acrylate, ethyleneoxide-modified (hereinafter this may be referred to as "EO") cresol(meth)acrylate, dipropylene glycol(meth)acrylate, ethoxylated phenyl(meth)acrylate, ethyl(meth)acrylate, isoamyl(meth)acrylate, isobutyl(meth)acrylate, isooctyl(meth)acrylate, cyclohexyl(meth)acrylate, isobornyl(meth)acrylate, dicyclopentanyl(meth)acrylate, dicyclopentanyloxyethyl(meth)acrylate, isomyristyl(meth)acrylate, lauryl(meth)acrylate, methoxydiproylene glycol(meth)acrylate, methoxytripropylene glycol(meth)acrylate, methoxypolyethylene glycol(meth)acrylate, methoxytriethylene glycol(meth)acrylate, methyl(meth)acrylate, neopentyl glycol benzoate(meth)acrylate, nonylphenoxypolyethylene glycol(meth)acrylate, nonylphenoxypolypropylene glycol(meth)acrylate, octyl(meth)acrylate, paracumylphenoxyethylene glycol(meth)acrylate, epichlorohydrin (hereinafter referred to as "ECH")-modified phenoxyacrylate, phenoxyethyl(meth)acrylate, phenoxydiethylene glycol(meth)acrylate, phenoxyhexaethylene glycol(meth)acrylate, phenoxytetraethylene glycol(meth)acrylate, polyethylene glycol(meth)acrylate, polyethylene glycol-polypropylene glycol(meth)acrylate, polypropylene glycol(meth)acrylate, stearyl(meth)acrylate, EO-modified succinic acid(meth)acrylate, tert-butyl(meth)acrylate, tribromophenyl(meth)acrylate, EO-modified tribromophenyl(meth)acrylate, tridodecyl(meth)acrylate, p-isopropenylphenol, styrene, α-methylstyrene, acrylonitrile.

Of those, in view of dry etching resistance, especially preferred are monofunctional (meth)acrylates having an aromatic group and/or an acyclic hydrocarbon group, and more preferred are monofunctional (meth)acrylates having an aromatic group. Examples of the monofunctional (meth)acrylates include benzyl(meth)acrylate, 1- or 2-naphthyl(meta)acrylate, 1- or 2-naphthylmethyl(meth)acrylate, dicyclopentanyl(meth)acrylate, dicyclopentanyloxyethyl (meth)acrylate, isobornyl(meth)acrylate, and adamantyl (meth)acrylate. Particularly preferred are benzyl(meth)acrylate, 1- or 2-naphthyl(meta)acrylate, and 1- or 2-naphthylmethyl(meth)acrylate.

As the other polymerizable composition (A2), also preferred is a polyfunctional polymerizable unsaturated monomer having two ethylenic unsaturated bond-containing groups.

Preferred examples of the difunctional polymerizable unsaturated monomer having two ethylenic unsaturated bond-containing groups for use in the invention include diethylene glycol monoethyl ether(meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth) acrylate, EO-modified bisphenol A di(meth)acrylate, PO-modified bisphenol A di(meth)acrylate, modified bisphenol A di(meth)acrylate, EO-modified bisphenol F di(meth) acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, polyethylene glycol-tetramethylene glycol)di(meth)acrylate, poly(propylene glycol-tetramethylene glycol)di(meth)acrylate, polyester (di)acrylate, polyethylene glycol di(meth)acrylate, polypropylene glycol di(meth)acrylate, ECH-modified propylene glycol di(meth) acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea.

Of those, especially preferred for use in the invention are neopentyl glycol di(meth)acrylate, 1,9-nonanediol di(meth) acrylate, tripropylene glycol di(meth)acrylate, tetraethylene glycol di(meth)acrylate, hydroxypivalate neopentyl glycol di(meth)acrylate, polyethylene glycol di(meth)acrylate, p- or m-xylylene di(meth)acrylate, etc.

Examples of the polyfunctional polymerizable unsaturated monomer having at least three ethylenic unsaturated bond-having groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth) acrylate, PO-modified trimethylolpropane tri(meth)acrylate, tris(acryloxyethyl)isocyanurate, dipentaerythritol hexa (meth)acrylate, caprolactone-modified dipentaerythritol hexa(meth)acrylate, dipentaerythritol hydroxy-penta(meth) acrylate, alkyl-modified dipentaerythritol penta(meth) acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the invention are EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra (meth)acrylate, pentaerythritol tetra(meth)acrylate, etc.

Among the above (meth)acrylate compounds, acrylate compounds are preferable from the viewpoint of curability.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

Examples of the oxirane ring-having compound (epoxy compound) preferred for use in the invention include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols produced by adding one or more alkylene oxides to aliphatic polyalcohol such as ethylene glycol, propylene glycol, glycerin or the like; diglycidyl esters of aliphatic long-chain dibasic acids; monoglycidyl ethers of aliphatic higher alcohols; monoglycidyl ethers of polyether alcohols produced by adding alkyleneoxide to phenol, cresol, butylphenol or the like; glycidyl esters of higher fatty acids, etc.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are UVR-6216 (by Union Carbide), Glycidol, AOEX24, Cyclomer A200 (all by Daicel Chemical Industry), Epikote 828, Epikote 812, Epikote 1031, Epikote 872, EpikoteCT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the other polymerizable compound (A2) for use in the invention, vinyl ether compounds may be used. Any known vinyl ether compounds are usable, including, for example, 2-ethylhexyl vinyl ether, butanediol 1,4-divinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, etc.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable compound (A2) for use in the invention, styrene derivatives may also be employed. The styrene derivatives include, for example, styrene, p-methylstyrene, p-methoxystyrene, β-methylstyrene, p-methyl-β-methylstyrene, α-methylstyrene, p-methoxy-β-methylstyrene, p-hydroxystyrene, etc.

For the purpose of enhancing the releasability from mold and the coatability of the composition, a fluorine atom-having compound may be incorporated into the composition. The compound includes, for example, trifluoromethyl(meth) acrylate, pentafluoroethyl(meth)acrylate, (perfluorobutyl) ethyl(meth)acrylate, perfluorobutyl-hydroxypropyl(meth) acrylate, (perfluorohexyl)ethyl(meth)acrylate, octafluoropentyl(meth)acrylate, perfluorooctylethyl(meth) acrylate, tetrafluoropropyl(meth)acrylate, etc.

As the other polymerizable compound (A2) for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, propenyl ether propylene carbonate, etc.

Preferable content of the other polymerizable compound (A2) varies depending on the content of the polymerizable compound (A1) having at least one of a fluorine atom and a silicon atom or a functional group. The other polymerizable compound (A2) is contained, for example, in a range of from 0 to 99.9% by mass, preferably from 50 to 99.8% by mass, and more preferably from 80 to 99.5% by mass, of the total amount of all the polymerizable compounds contained in the composition of the invention.

(Polymerizable Compounds)

Preferable embodiments of the composition of the polymerizable compound (A1) having at least one of a fluorine atom and a silicon atom or a functional group and the other polymerizable compound (A2) are described hereinafter.

A polymerizable compound having one polymerizable functional group (monofunctional polymerizable compound) is generally used as a reactive diluent, and has an effect of lowering the viscosity of the curable composition for imprints of the invention, and it is preferably added in an amount of at least 15% by mass, more preferably from 20 to 90% by mass, even more preferably from 25 to 85% by mass, and particularly preferably from 30 to 80% by mass, relative to the total amount of the polymerizable compounds.

A polymerizable compound having two polymerizable functional groups (difunctional polymerizable monomer) is added in an amount of preferably at most 90% by mass, more preferably at most 80% by mass, and particularly preferably at most 70% by mass, relative to the total amount of the polymerizable compounds.

The proportion of the monofunctional and difunctional polymerizable compounds to be added is preferably from 10 to 100% by mass, more preferably from 30 to 100% by mass, and particularly preferably from 50 to 100% by mass, relative to the total amount of the polymerizable compounds.

A polymerizable compound having three or more polymerizable functional groups is added in an amount of preferably at most 80% by mass, more preferably at most 60% by mass, and particularly preferably at most 40% by mass, relative to the total amount of the polymerizable compounds. When the polymerizable compound having three or more polymerizable functional groups is added in an amount of at most 80% by mass, the viscosity of the composition can be preferably reduced.

The curable composition of the invention preferably contains at least one of the polymerizable compound (A1) having at least one of a fluorine atom and a silicon atom or a functional group and the other polymerizable compound (A2) has a (meth)acrylate group from the viewpoint of curability and pattern strength.

<Photopolymerization Initiator (B)>

The curable composition for imprints of the invention comprises a photopolymerization initiator. As the photopolymerization initiator in the invention, usable is any compound capable of generating an active radical for polymerization of the above-mentioned polymerizable monomer through photoirradiation. As the photopolymerization initiator, preferred are cationic polymerization initiators and radical polymerization initiators, and more preferred are radical polymerization initiators. In the invention, two or more different types of photopolymerization initiators may be used, as combined.

The content of the photopolymerization initiator may be, for example, from 0.01 to 15% by mass of all the components constituting the composition except solvent, preferably from 0.1 to 12% by mass, more preferably from 0.2 to 7% by mass. In case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better. Heretofore, inkjet compositions and compositions for liquid-crystal display color filters containing dye and/or pigments have been variously investigated in point of the preferred amount of the photopolymerization initiator and/or the photoacid generator to be in the compositions; however, there is no report relating to the preferred amount of the photopolymerization initiator and/or the photoacid generator to be added to curable compositions for imprints. In this connection, in the systems containing dye and/or pigment, the dye and/or the pigment may act as a radical-trapping agent and may have some influence on the photopolymerization and the sensitivity of the compositions. Taking this into consideration, the amount of the photopolymerization initiator to be added to these applications is optimized. On the other hand, in the composition for imprints of the invention, dye and/or pigment are not indispensable ingredients, and the optimum range of the photopolymerization initiator in the composition may differ from that in the field of inkjet compositions and compositions for liquid-crystal display color filters.

As the radical photopolymerization initiator for use in the invention, preferred are acylphosphine oxide compounds and oxime ester compounds from the viewpoint of the curing sensitivity and the absorption property of the composition. As the cationic polymerization initiator, preferred are sulfonium salt compounds and iodonium salt compounds. The radical photopolymerization initiator for use in the invention may be commercial products. As their examples preferred for use herein, there may be mentioned those described in, for example, JP-A 2008-105414, paragraph [0091].

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

<(C) Compound Having Functional Group Capable of Bonding to Substrate>

The curable composition for imprints of the invention contains the compound (C) having a functional group capable of bonding to a substrate.

The bonding mode between a substrate and the ingredient (C) includes covalent bonding, hydrogen bonding, coordination bonding, ionic bonding, etc. Preferred are covalent bonding and hydrogen bonding; more preferred is covalent bonding; and even more preferred is siloxane bonding. In this description, the bonding between a substrate and the ingredient (C) does not fall within the scope of the polymerization reaction by polymerizing functional group.

In the invention, preferably, the compound (C) having a functional group capable of bonding to a substrate contains a silicon atom-having group as the functional group capable of bonding to a substrate therein. More preferably, the compound (C) having a functional group capable of bonding to a substrate is a silane coupling agent.

Not specifically defined, the content of the ingredient (C) in the curable composition for imprints of the invention is preferably from 0.1 to 50% by mass of the total of all the polymerizable compound in the composition from the viewpoint of the adhesiveness of the composition to a substrate, more preferably from 1 to 30% by mass, even more preferably from 3 to 30% by mass.

The functional group capable of bonding to a substrate is preferably a group of the following formula (IV):

In formula (IV), Ra' to Rc' each independently represent an alkoxy group, an acyloxy group, a halogen atom, or an alkyl group; and at least one of them is a group selected from an alkoxy group, an acyloxy group and a halogen atom.

Preferably, the compound (C) having a functional group capable of bonding to a substrate further has a functional group capable of reacting with the polymerizable compound (A1) having at least one of a fluorine atom and a silicon atom or a functional group capable of reacting with the other polymerizable compound (A2) (hereinafter this may be referred to as a functional group capable of reacting with the ingredient (A1) or the ingredient (A2)), in addition to the functional group capable of bonding to a substrate therein.

More preferably, the functional group capable of reacting with the ingredient (A1) or the ingredient (A2) is a polymerizable group capable of reacting with the polymerizable functional group that the ingredient (A1) or the ingredient (A2) has. Preferred examples of the polymerizable group include a radical-polymerizable group such as a (meth)acrylate group, a styryl group, an allyl group, a vinyl group, etc.; a cationic polymerizable functional group such as an epoxy group, an oxetanyl group, a vinyl ether group, etc. Preferred is a radical polymerizable functional group, and more preferred is a (meth)acrylate group.

Preferably, the compound (C) having a functional group capable of bonding to a substrate is a silane coupling group having a polymerizable group (more preferably, having a polymerizable group capable of reacting with the polymerizable functional group that the ingredient (A1) or the ingredient (2) has), and is even more preferably a structure of the following formula (V):

In formula (V), X represents a polymerizable functional group; A represents a linking group; Ra" to Rc" each represent an alkoxy group, an acyloxy group, a halogen atom or an alkyl group, and at least one of them is a group selected from an alkoxy group, an acyloxy group and a halogen atom; q indicates an integer of from 1 to 5; r indicates an integer of from 1 to 5.

Preferably, X includes a radical polymerizable group such as a (meth)acrylate group, a styryl group, an allyl group, a vinyl group, etc.; a cationic polymerizable group such as an epoxy group, an oxetanyl group, a vinyl ether group, etc. Preferred is a radical polymerizable group, and more preferred is a (meth)acrylate group.

Preferably, A has a alkylene group having at least 2 carbon atoms. As the linking group for the alkylene group, A may include a linking group having a nitrogen atom, an oxygen atom or a sulfur atom.

q is preferably from 1 to 3.

r is preferably from 1 to 3.

The polymerizable group-having silane coupling agent includes a silane coupling agent having a carbon-carbon unsaturated bond. The carbon-carbon unsaturated bond-having silane coupling agent includes γ-acryloyloxypropyltrimethoxysilane, γ-acryloyloxypropyltriethoxysilane, γ-methacryloyloxypropyltrimethoxysilane, γ-methacryloyloxypropyltriethoxysilane, 4-trimethoxysilylstyrene, etc.

The cationic polymerizable group-having silane coupling agent includes a silane coupling agent having an epoxy group of the following formulae:

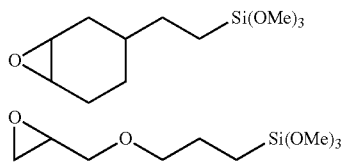

Also preferred is a silane coupling agent having both a carbon-carbon unsaturated bond and a nitrogen atom; and also preferred is a silane coupling agent having both a carbon-carbon unsaturated bond and an amino group.

The silane coupling agent having both a carbon-carbon unsaturated bond and a nitrogen atom includes the following structures. The silane coupling agents shown below can be prepared in a simple manner by mixing a difunctional or more polyfunctional (meth)acrylate compound and an aminopropyl group-having silane coupling agent.

<Other Ingredients>

The curable composition for imprints of the invention may contain any other ingredients than the above-mentioned polymerizable compound (A), the photopolymerization initiator (B) and the compound having a functional group capable of bonding to a substrate, in accordance with various purposes and not detracting from the effect of the invention. The additional ingredients include a surfactant, an antioxidant, a solvent, a polymer ingredient, a pigment, a dye, etc. Preferably, the curable composition for imprints of the invention contains at lest one selected from a surfactant and an antioxidant.

—Surfactant—

Preferably, the curable composition for imprints of the invention comprises a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferred are nonionic surfactants. Preferably, the composition comprises at least one of a fluorine-containing surfactant, a silicone-type surfactant and a fluorine-containing silicone-type surfactant. More preferably, the composition comprises both a fluorine-containing surfactant and a silicone-type surfactant, or a fluorine-containing silicone-type surfactant. The most preferably, the composition comprises a fluorine-containing silicone-type surfactant. As the fluorine-containing surfactant and the silicone-type surfactant, preferred are nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A, F780F (Dai-Nippon Ink's trade names).

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

—Antioxidant—

Preferably, the curable composition for imprints of the invention comprises a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF); Antigene P, 3C, FR, Sumilizer S, Sumilizer GA80 (by Sumitomo Chemical); Adekastab AO70, AO80, AO503 (by Adeka), etc. These may be used either singly or as combined.

—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount.

—Solvent—

A solvent may be used for the curable composition for imprints of the invention, in accordance with various needs. The "solvent" here does not include the polymerizable compounds and compounds having at least one of the polymerizable functional groups. In particular, when a pattern having a thickness of at most 500 nm is formed, the composition preferably comprises a solvent. Preferably, the solvent has a boiling point at normal pressure of from 70 to 200° C. Regarding the type of the solvent, any solvent capable of dissolving the composition may be used. Preferable examples of the solvents include solvents having an ester structure, a ketone structure, a hydroxyl group, an ether structure. Preferred among them are solvents having at least any one of an ester structure, a ketone structure, a hydroxyl group and an ether structure in view of evenness of a coated thin layer. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the curable composition for imprints of the invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition, more preferably from 0 to 97% by mass. In forming a patter having a thickness of at most 500 nm by spin coating or other methods, the solvent content is preferably from 20 to 99% by mass, more preferably from 40 to 99% by mass, particularly preferably from 70 to 98% by mass.

—Polymer Ingredient—

The curable composition for imprints of the invention may comprise a polyfunctional oligomer having a larger molecular weight than that of the above-mentioned polyfunctional polymerizable compound within a range capable of attaining the object of the invention, for the purpose of further increasing the crosslinking density of the composition. Examples of the photoradical-polymerizable polyfunctional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints of the invention may comprise any other polymer ingredient for the purpose of enhancing the dry etching resistance, the imprint aptitude and the curability of the composition. The polymer ingredient is preferably a polymer having a polymerizable functional group in the side chain thereof. The weight-average molecular weight of the polymer ingredient is preferably from 2000 to 100000, more preferably from 5000 to 50000, from the viewpoint of the miscibility of the polymer with the polymerizable monomers constituting the composition. The amount of the polymer ingredient to be added may be preferably from 0 to 30% by mass of the composition except the solvent therein, more preferably from 0 to 20% by mass, even more preferably from 0 to 10% by mass, most preferably at most 2% by mass. When the content of the compound having a molecular weight of at least 2000 in the composition of the invention is at most 30% by mass of the composition except the solvent therein, then the patternability of the composition is bettered. From the viewpoint of the patternability of the composition, the content of such compound is preferably as small as possible, and except for the surfactant and other minor additives, preferably, the composition does not comprise any additional resin ingredient.

In addition to the above-mentioned ingredients, the curable composition for imprints of the invention may comprise, if desired, release agent, silane coupling agent, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

(Process for Preparing the Curable Composition for Imprints)

The curable composition for imprints of the invention may be produced by mixing the above-mentioned ingredients. The ingredients for the curable composition are generally mixed and dissolved at a temperature falling within a range of from 0° C. to 100° C. After the ingredients are mixed, the resulting mixture is preferably filtered through a filter having a pore size of from 0.003 μm to 5.0 μm. The filtration may be effected in plural stages, or may be repeated plural times. The solution once filtered may be again filtered. Not specifically defined, the material of the filter may be any one, for example, polyethylene resin, polypropylene resin, fluororesin, nylon resin, etc.

(Properties of Curable Composition for Imprints)

Preferably, the viscosity of the mixture of all the ingredients except the solvent of the curable composition for imprints of the invention is at most 100 mPa·s, more preferably from 1 to 70 mPa·s, even more preferably from 2 to 50 mPa·s, most preferably from 3 to 30 mPa·s.

The curable composition for imprints of the invention can form a micropattern at low cost and with high accuracy according to a photonanoimprinting method using it. Therefore, the composition can form the same pattern as that formed through conventional photolithography with a further higher degree of accuracy at a lower cost. For example, when the composition of the invention is applied onto a substrate or a support and the resulting layer of the composition is exposed to light, cured and optionally dried (baked), then a permanent film of an overcoat layer or an insulating layer for use in liquid-crystal displays (LCD) may be formed, or the composition may be used as an etching resist in producing semiconductor integrated circuits, recording materials, flat panel displays, etc.

Regarding the permanent film (resist in structure parts) for use in liquid-crystal displays (LCD) or the resist for use in substrate processing for electronic materials, it is desirable that the resist is prevented as much as possible from being contaminated with metal or organic ionic impurity in order not to inhibit the movement of the devices. Therefore, in the curable composition for imprints of the invention, the metal or organic ionic impurity concentration is preferably at most 1000 ppm, more preferably at most 10 ppm, even more preferably at most 100 ppb.

[Patterning Method]

The patterning method (especially micropatterning method) of using the curable composition for imprints of the invention is described below. The patterning method of the invention comprises a step of applying the curable composition for imprints of the invention onto a substrate (this term in the specification includes a base and a support) to form a patterning layer thereon, a step of pressing a mold against the surface of the patterning layer, and a step of irradiating the patterning layer with light to cure the curable composition of the invention whereby a micropattern can be formed.

The curable composition for imprints of the invention may be cured by heating after the irradiation with light. More specifically, A composition for a pattern forming layer containing the composition of the invention is provided on a substrate (a base or a support) and optionally dried to form a layer composed of the composition of the invention (pattern forming layer) whereby a pattern receiving element having the patterning layer on the substrate is obtained. A mold is pressed on the surface of the patterning layer on the pattern receiving element and treated to transfer the mold pattern, and then the patterning layer having a micropattern is cured by irradiation with light. The photoimprint lithography in accordance with the patterning method of the invention can be applied to lamination and multipatterning and can be used with a normal thermal imprinting in combination.

Hereinafter, the patterning method using the curable composition for imprints of the invention (pattern transferring method) will be specifically described.

In the patterning method of the invention, the composition of the invention is first provided (preferably coated) onto the substrate to form a patterning layer.

The method for providing the curable composition for imprints of the invention onto a substrate may be a well known providing method and generally a coating method can be used.

As the method for providing the curable composition for imprints of the invention, a dip coating method, an air knife coating method, a curtain coating method, a wire bar coating method, a gravure coating method, an extrusion coating method, a spin coating method, a slit scanning method, an inkjet method, etc can be used to form a coated membrane or liquid particles on the substrate. The thickness of the patterning method of the composition of the invention may vary depending on the use thereof, and may be from 0.03 µm to 30 µm or so. The composition of the invention may be applied in a mode of multilayer coating. In the inkjet method and the like, the amount of a liquid particle provided on the substrate is preferably about 1 pl to about 20 pl. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched. The pattern to be formed of the composition of the invention may have good adhesiveness to the organic layer, if any, formed on the substrate.

The substrate (preferably base or support) to which the curable composition for imprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. Among them, preferred is a substrate that is reactive with a silane coupling agent, more preferred is a substrate that is capable to forming a siloxane bond with a silane coupling agent, particularly preferred is a substrate containing silicon atom, especially a silicon substrate and a glass substrate, as the substrate to which the curable composition for imprints of the invention is applied. The shape of the substrate is not also specifically defined. It may be tabular or roll. As described below, the substrate may be light-transmissive or non-light-transmissive, depending on the combination thereof with a mold.

Next, in the patterning method of the invention, a mold is pressed against the surface of the patterning layer in order to transfer the pattern onto the patterning layer whereby a micropattern formed on the pressing surface of the mold can be transferred to the patterning layer.

The composition of the invention can be used to form the pattern on the mold and it can be pressed on the surface of the patterning layer in a substrate.

The mold material usable in the invention is described. In the photoimprint lithography with the composition of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for imprints of the invention is provided onto a light-transmissive substrate, then a mold is pressed against it, and this is irradiated with light from the back of the substrate whereby the curable composition for imprints of the invention can be cured.

The irradiation with light can be conducted on the state where the mold is kept in contact or after the mold is released. In the invention, the irradiation is preferably conducted on the state where the mold is kept in contact.

As the mold that can be used in the invention, a mold having a transferable pattern formed thereon is used. The pattern on the mold may be formed, for example, through photolithography, electronic beam lithography, or the like according to the desired processing accuracy, but in the invention, the mold patterning method is not specifically defined.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold that can be used in the invention when a light-transmissive mold material is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold that can be used in the patterning method of the invention may be subjected to release treatment for the purpose of further enhancing the releasability of the curable composition for imprint of the invention from the surface of the mold. Such a release treatment of the mold includes, for example, a treatment by a silicone-based, fluorine-based, or other type of silane coupling agent. Further, for example, commercial release agents such as Optool DSX manufactured by Daikin Industries, Ltd., Novec EGC-1720 manufactured by Sumitomo 3M Limited, and the like can be suitably used for the release treatment of the mold.

In case where the photoimprint lithography is performed using the composition of the invention, the patterning method of the invention is generally preferably performed at a mold pressure of 10 MPa or less. By setting the mold pressure at 10 MPa or less, the mold and the substrate become hard to deform and the patterning accuracy tends to increase. Furthermore, since the applied pressure is low, the device tends to be small-sized and thereby preferable. The mold pressure is preferably determined so that the residual film of the composition for imprints in the mold projections can be reduced, and thus the uniformity in the mold transfer is ensured.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition and on the tackiness of the cured film as previously determined.

In the photoimprint lithography applied to the invention, the substrate temperature in photoirradiation may be room temperature; however, the photoirradiation may be attained under heat for enhancing the reactivity. In the previous stage of photoirradiation, preferably, the system is kept in vacuum as effective for preventing contamination with bubbles or contamination with oxygen or for preventing the reduction in reactivity, and as effective for enhancing the adhesiveness of the curable composition with mold. The system may be subjected to photoirradiation while still kept in vacuum. In the patterning method of the invention, the vacuum degree in photoirradiation is preferably from $10^{-1}$ Pa to ordinary pressure.

Light to be used for photoirradiation to cure the composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 100 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

Because the curable composition of the invention is used, the patterning method of the invention can be preferably used to repeatedly form a pattern having an aspect ratio (this ratio in the specification is the ratio of the depth of the pattern to line width, (depth/width)) of at least 2, more preferably at least 2.5, particularly preferably at least 3.

[Pattern]

The pattern thus formed according to the patterning method of the invention as described in the above can be used as a permanent film (resist for structural members) for use in liquid-crystal displays (LCD) and others, or as an etching resist. After its production, the permanent film may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

The pattern formed according to the patterning method of the invention is useful as an etching resist. In case where the curable composition for imprints of the invention is sued as an etching resist, first, the composition of the invention is applied onto a substrate, for example, a silicon wafer or the like with a thin film of SiO$_2$ or the like formed thereon, and patterned according to the patterning method of the invention to thereby form a nano-order micropattern on the substrate. Subsequently, this is wet-etched with hydrogen fluoride or the like, or dry-etched with an etching gas such as CF$_4$ or the like, thereby forming a desired pattern on the substrate. Preferably, the curable composition for imprints of the invention has good etching resistance in dry etching with carbon fluoride or the like.

Using the composition of the invention, the pattern of the invention preferably has an aspect ratio of at least 2, more preferably at least 2.5, even more preferably at least 3.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

Preparation of Curable Composition

Examples 1 to 14, Comparative Examples 1 to 9

To the polymerizable compound (A1) shown in Table 1 below, added were the following polymerization initiator P-1 (2% by mass), the following surfactant W-1 (0.1% by mass), the following surfactant W-2 (0.04% by mass), the following antioxidant A-1 (1% by mass) and the following antioxidant A-2 (1% by mass). Further, as a polymerization initiator, 4-methoxyphenol was added thereto as so controlled that its amount could be 200 ppm relative to the polymerizable compound. This was filtered through a 0.1-μm tetrafluoroethylene-made filter to prepare a curable composition. In Table 1, the ingredients are in a ratio by mass.

<(A1) Polymerizable Compound Having at Least One of a Fluorine Atom and a Silicon Atom>

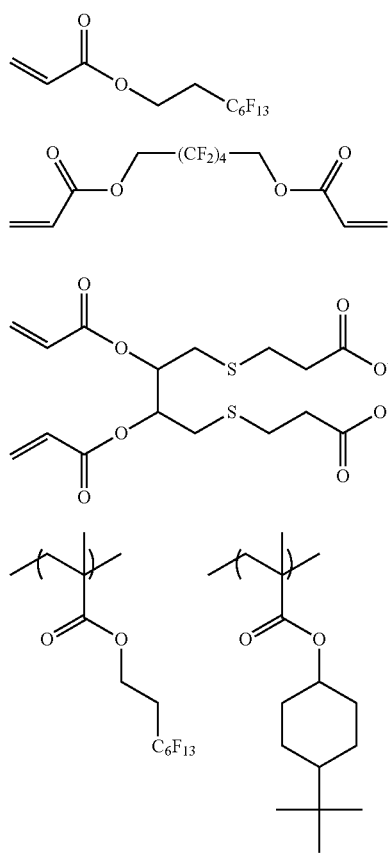

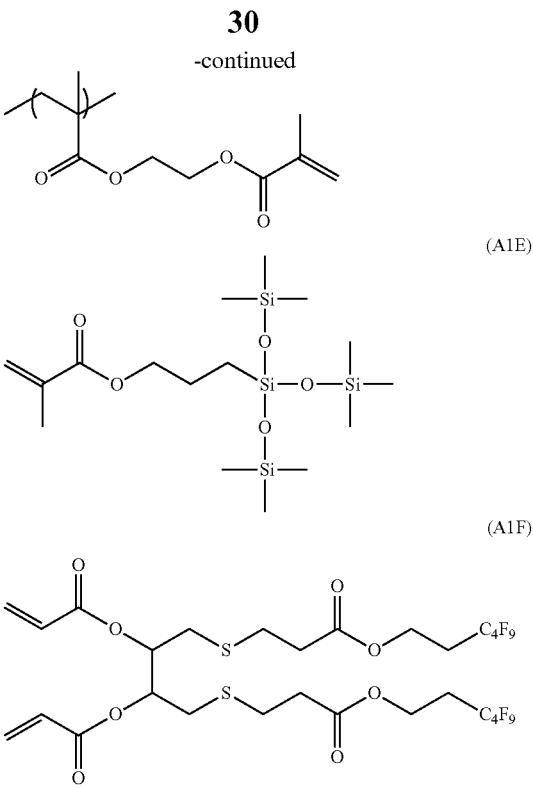

<(A2) Other Polymerizable Compound>
R-1: Benzyl acrylate (Biscoat #160, by Osaka Organic Chemical) (viscosity at 25° C., 2.3 mPa·s).
R-2: 2-Naphthylmethyl acrylate (produced from 2-bromomethylnaphthalene and acrylic acid in an ordinary method) (viscosity at 25° C., 10.8 mPa·s).
R-3: Neopentylglycol diacrylate (Kayarad NPGDA, by Nippon Kayaku) (viscosity at 25° C., 5.7 mPa·s).
R-4: M-xylylene diacrylate (produced from α,α'-dichloro-m-xylene and acrylic acid in an ordinary method) (viscosity at 25° C., 9.7 mPa·s).
R-5: Trimethylolpropane triacrylate (Aronix M309, by To a Gohsei) (viscosity at 25° C., 72 mPa·s).
R-6: Isobornyl acrylate (IBXA, by Osaka Organic Chemical) (viscosity at 25° C., 10.7 mPa·s).
<(C) Compound Having Functional Group Capable of Bonding to Substrate>

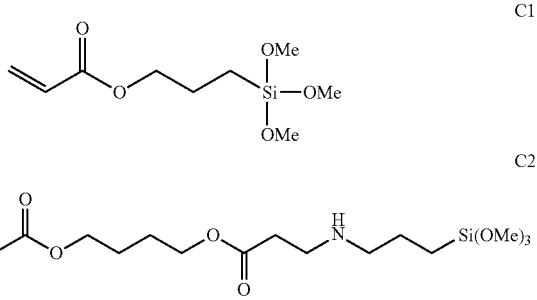

<Photopolymerization Initiator>
P-1: 2,4,6-Trimethylbenzoyl-ethoxyphenyl-phosphine oxide (Lucirin TPO-L, by BASF).
<Surfactant>
W-1: Fluorosurfactant (Tochem Products' fluorosurfactant).
W-2: Silicone surfactant (Dai-Nippon Ink Chemical Industry's Megafac Paintad 31).

<Antioxidant>

A-1: Sumilizer GA80 (by Sumitomo Chemical Industry).

A-2: Adekastab AO503 (by ADEKA).

(Production of Polymer (A1D))

Methyl ethyl ketone (4.2 g) was put into a three-neck flask and heated in a nitrogen current atmosphere at 80° C. To this was dropwise added a solution prepared by dissolving tridecafluorooctyl methacrylate (4.5 g), 4-tert-butylcyclohexyl methacrylate (3.9 g), a compound "1" (2.0 g) and a polymerization initiator (Wako Pure Chemical's V-601) (0.48 g) in methyl ethyl ketone (38 g), taking 4 hours. After the addition, this was reacted at 80° C. for 3 hours to give a polymer "2". To the solution, added was diazabicycloundecene (3.2 g) and reacted at room temperature for 10 hours. The reaction liquid was poured into water/methanol (10/90) (500 ml), and the resulting powder was collected through filtration, washed and dried to give a polymer (A1D) (8.7 g). Its molecular weight was measured through GPC. As a result, the weight-average molecular weight of the polymer in terms of standard polystyrene was 12000, and the degree of dispersion thereof was 1.9.

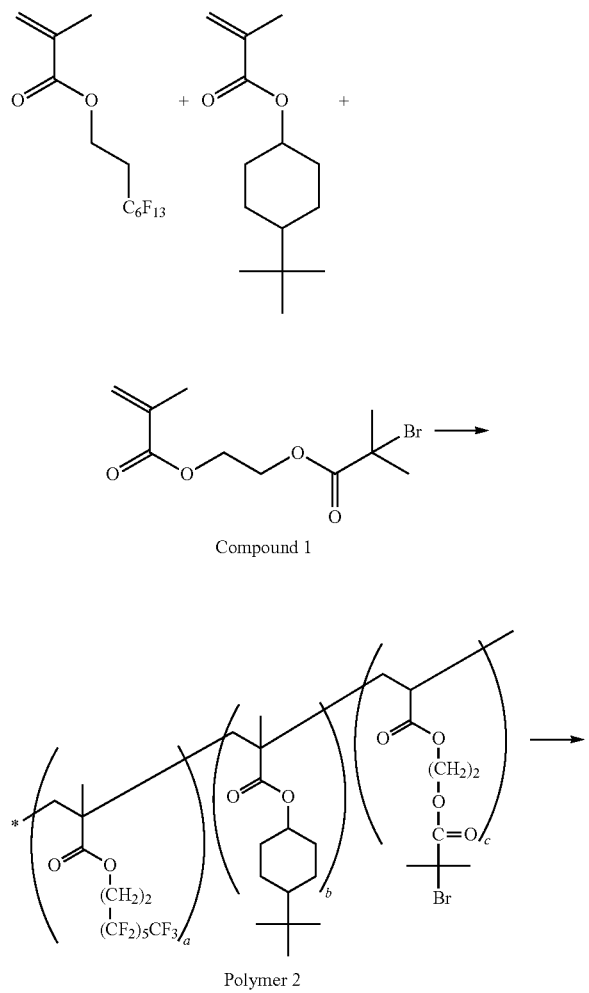

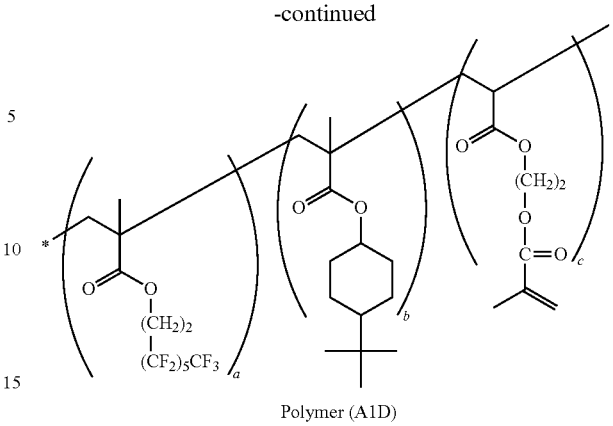

Polymer (A1D)

In the formula, a/b/c=30/50/20. In the polymer 2 and the polymer (A1D), a, b and c each indicate the ratio of the corresponding recurring unit, totaling 100%.

(Evaluation)

Thus produced, the curable compositions of Examples and Comparative Examples were evaluated as follows. The results are shown in Table 1 below.

<Patternability Evaluation 1>

The curable composition prepared in the above was applied onto a silicon substrate in a mode of spin coating. 20 coated sample sheets were thus produced for one and the same sample composition. On the coated sample sheet, a quartz mold was put, of which the surface had a rectangular line/space pattern (1/1) having a line width of 50 nm and a groove depth of 75 nm (aspect ratio of 1.5) and of which the patterned surface had been processed with a perfluoropolyether structure-having silane coupling agent (Daikin Industry's Optool DSX); and this was set in a nanoimprinting apparatus. The apparatus was vacuumed and then purged with nitrogen whereby the apparatus had a nitrogen atmosphere inside it. At 25° C. and under a pressure of 0.5 MPa, the mold was pressed against the substrate, and the substrate was exposed to light from the back thereof at 240 mJ/cm². After the exposure, the mold was released to give a pattern. Using the same mold, 20 coated samples were successively processed for pattern transferring thereonto. The pattern formed in the 1st-run transfer and the pattern formed in the 20th-run transfer were observed with a scanning microscope and checked for the region with no mold pattern reproduction failure such as pattern peeling, cracking or crushing.

A: No pattern deficiency was seen at all.

B: The pattern partly had a deficiency, which was less than 5% of the total pattern area.

C: The pattern partly had a deficiency, which was within a range of from 5 to 10% of the total pattern area.

D: The pattern had a deficiency, which was more than 10% of the total pattern area.

<Patternability Evaluation 2>

This is the same as the patternability evaluation 1, except that the mold pattern size was changed here to a line width of 50 nm and a groove depth of 150 nm (aspect ratio of 3).

TABLE 1

| | Compound (A1) having at least one of fluorine atom and silicon atom (part by mass) | | | | | | | Other Polymerizable Compound (A2) (part by mass) | | | | | | Compound (C) having functional group capable of bonding to substrate (part by mass) | | Patternability Evaluation 1 (aspect ratio, 1.5) | | Patternability Evaluation 2 (aspect ratio, 3) | |
|---|---|---|---|---|---|---|---|---|---|---|---|---|---|---|---|---|---|---|---|
| | A1A | A1B | A1C | A1D | A1E | A1F | fluorine content | R-1 | R-2 | R-3 | R-4 | R-5 | R-6 | C1 | C2 | 1st-run | 20th-run | 1st-run | 20th-run |
| Example 1 | 5 | | | | | | 59% | | 45 | 50 | | | | 5 | | A | A | A | A |
| Example 2 | 5 | | | | | | 59% | | | 50 | | 45 | | 5 | | A | A | A | A |
| Example 3 | 5 | | | | | | 59% | 35 | | | | 40 | 20 | 5 | | A | A | A | A |
| Example 4 | | 5 | | | | | 41% | | | 50 | | 45 | | 5 | | A | A | A | B |
| Example 5 | | | 1 | | | | 45% | | | 90 | | | | 10 | | A | A | A | A |
| Example 6 | | | | 1 | | | 26% | 35 | | | | 40 | 20 | 5 | | A | A | A | A |
| Example 7 | | | | | 10 | | 0% | | 45 | 50 | | | | 5 | | A | A | A | B |
| Example 8 | | 5 | | | | | 41% | | | 50 | | 45 | | | 5 | A | A | A | A |
| Example 9 | | | | | 10 | | 0% | | 45 | 50 | | | | | 5 | A | A | A | A |
| Example 10 | | | 5 | | | | 45% | | 45 | 50 | | | | 5 | | A | A | A | A |
| Example 11 | | | 1 | | | | 45% | | 45 | 50 | | | | 5 | | A | A | A | A |
| Example 12 | | | | | | 5 | 38% | | 45 | 50 | | | | 5 | | A | A | A | A |
| Example 13 | | | | | | 1 | 38% | | 45 | 50 | | | | 5 | | A | A | A | A |
| Example 14 | 1 | | | | | | 59% | | 45 | 50 | | | | 5 | | A | A | A | B |
| Comparative Example 1 | no | | | | | | 0% | | 45 | 45 | | | | no | | B | C | C | D |
| Comparative Example 2 | 5 | | | | | | 59% | | 45 | 45 | | | | no | | A | B | B | C |
| Comparative Example 3 | no | | | | | | 0% | | 45 | 45 | | | | 5 | | B | C | B | C |
| Comparative Example 4 | no | | | | | | 0% | | | 45 | | 45 | | no | | B | C | C | D |
| Comparative Example 5 | 5 | | | | | | 59% | | | 45 | | 45 | | no | | A | B | B | C |
| Comparative Example 6 | no | | | | | | 0% | | | 45 | | 45 | | 5 | | B | C | B | C |
| Comparative Example 7 | no | | | | | | 0% | 30 | | | | 40 | 20 | no | | B | C | C | D |
| Comparative Example 8 | 5 | | | | | | 59% | 30 | | | | 40 | 20 | no | | A | B | B | C |
| Comparative Example 9 | no | | | | | | 0% | 30 | | | | 40 | 20 | 5 | | B | C | B | C |

As in Table 1, in Examples using the curable composition for imprints of the invention, the patternability was all the time good in transferring high-aspect patterns or in repeated pattern transferring or further in repeatedly transferring high-aspect patterns. On the other hand, in Comparative Examples, the compositions were inferior in point of both the high-aspect ratio patternability and the repeated patternability, and in particular, it is known that the comparative compositions were inferior in the repeated patternability in forming high-aspect ratio patterns.

The invention claimed is:

1. A curable composition for imprints, comprising:
   (A1) a polymerizable compound having at least one of a fluorine atom or a silicon atom, except the compound (C) mentioned below that has a functional group capable of bonding to a substrate,
   (A2) a polymerizable compound other than a polymerizable compound having at least one of a fluorine atom or a silicon atom,
   (B) a photopolymerization initiator, and (C) a compound having a functional group capable of bonding to a substrate, wherein:

the content of the polymerizable compound (A1) is 1 to 10% by mass of the total amount of all polymerizable compounds contained in the composition, the content of the other polymerizable compound (A2) is from 50 to 99.8% by mass of the total amount of all polymerizable compounds contained in the composition, at least one polymerizable compound of the polymerizable compound (A1) and at least one polymerizable compound of the polymerizable compound (A2) each has a (methy)acrylate group, the polymerizable compound (A2) has only a (meth)acrylate group as a polymerizable functional group, and at least one kind of the polymerizable compound (A2) has two (meth)acrylate groups.

2. The curable composition for imprints according to claim 1, wherein the compound (C) having a functional group capable of bonding to a substrate further has a functional group capable of reacting with the polymerizable compound (A1) having at least one of a fluorine atom or a silicon atom, or a functional group capable of reacting with the other polymerizable compound (A2).

3. The curable composition for imprints according to claim 1, wherein the polymerizable compound (A1) having at least one of a fluorine atom or a silicon atom is a polymerizable non-polymer compound having a fluorine atom and having a fluorine content of from 30 to 60%.

4. The curable composition for imprints according to claim 1, wherein the polymerizable compound (A1) having at least one of a fluorine atom or a silicon atom is a polymerizable polymer compound having a fluorine atom and having a fluorine content of from 10 to 50%.

5. The curable composition for imprints according to claim 1, wherein the polymerizable compound (A1) having at least one of a fluorine atom or a silicon atom is a polymerizable compound having at least one of a perfluoroalkyl group or a perfluoroalkylene group.

6. The curable composition for imprints according to claim 1, wherein the polymerizable compound (A1) having at least one of a fluorine atom or a silicon atom has two or more fluorine-having groups in the molecule.

7. The curable composition for imprints according to claim 1, wherein the polymerizable compound (A1) having at least one of a fluorine atom or a silicon atom is a polymerizable compound having at least one of a trialkylsilyl group, a linear siloxane structure, a cyclic siloxane structure, or a caged siloxane structure.

8. The curable composition for imprints according to claim 1, wherein the compound (C) having a functional group capable of bonding to a substrate has a silicon atom-having group as the functional group capable of bonding to a substrate.

9. The curable composition for imprints according to claim 8, wherein the compound (C) having a functional group capable of bonding to a substrate is a silane coupling agent having a carbon-carbon unsaturated bond and a nitrogen atom.

10. The curable composition for imprints according to claim 9, wherein the compound (C) having a functional group capable of bonding to a substrate is a silane coupling agent having a carbon-carbon unsaturated bond and an amino group.

11. The curable composition for imprints according to claim 8, wherein the compound (C) having a functional group capable of bonding to a substrate is a silane coupling agent having a structure of the following formula (V):

wherein X represents a polymerizable functional group; A represents a linking group; Ra" to Rc" each represents an alkoxy group, an acyloxy group, a halogen atom or an alkyl group, and at least one of them is a group selected from an alkoxy group, an acyloxy group and a halogen atom; q indicates an integer of from 1 to 5; and r indicates an integer of from 1 to 5.

12. The curable composition for imprints according to claim 11, which comprises at least one of the following (C1) to (C2) as the silane coupling agent having a structure of the formula (V):

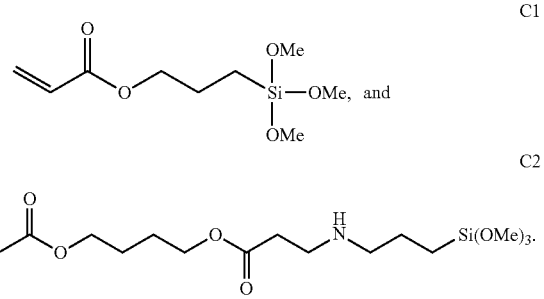

13. The curable composition for imprints according to claim 1, wherein the substrate is a silicon substrate or a glass substrate.

14. The curable composition for imprints according to claim 1, wherein the polymerizable compound (A1) having at least one of a fluorine atom or a silicon atom is a compound having a partial structure of the following formula (I):

$$-CH_2CH_2-C_nF_{2n+1} \quad (I)$$

wherein n indicates an integer of from 1 to 8.

15. The curable composition for imprints according to claim 1, wherein the polymerizable compound (A1) having at least one of a fluorine atom or a silicon atom is a compound having a partial structure of the following formula (II):

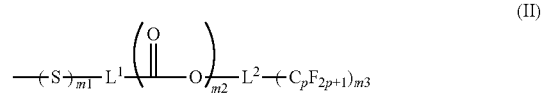

wherein $L^1$ represents a single bond, or an alkylene group having from 1 to 8 carbon atoms; $L^2$ represents a linking group; m1 and m2 each indicate 0 or 1, and at least one of m1 and m2 is 1; m3 indicates an integer of from 1 to 3; p indicates an integer of from 1 to 8; when m3 is 2 or more, ($-C_pF_{2p+1}$)'s may be the same or different.

16. The curable composition for imprints according to claim 1, which comprises at least one of the following (A1A)

to (A1F) as the polymerizable compound (A1) having at least one of a fluorine atom or a silicon atom:

(A1A)
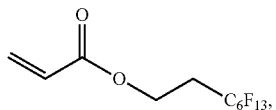

(A1B)
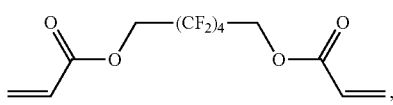

(A1C)
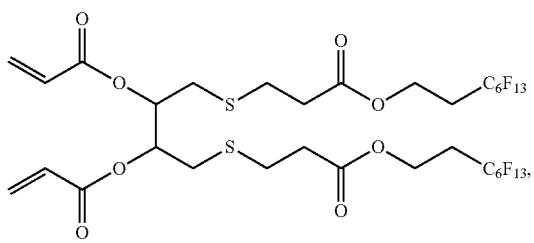

(A1D)
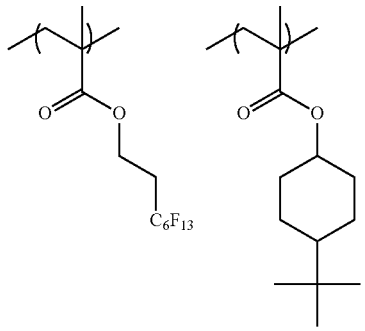

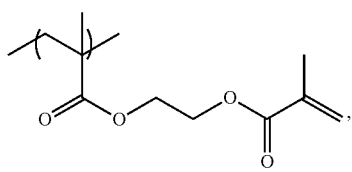

(A1E)
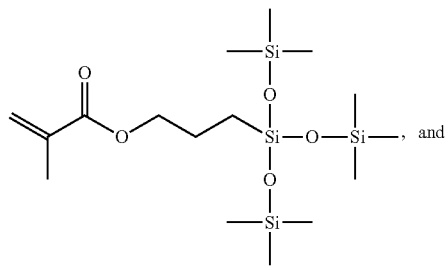
and (A1F)
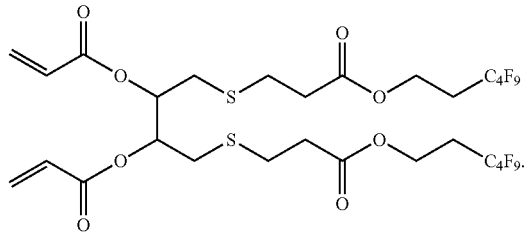

17. A patterning method comprising:
applying the curable composition for imprints according to claim 1 onto a substrate to form a patterning layer thereon,
pressing a mold against the surface of the patterning layer, and
irradiating the patterning layer with light.

18. A pattern formed according to the patterning method of claim 17.

19. A curable composition for imprints, comprising:
(A1) a (meth)acrylate compound having a partial structure represented by the formula (I):

$$-CH_2CH_2-C_nF_{2n+1}$$

wherein n indicates an integer of from 1 to 8;
(A2) a polymerizable compound other than a polymerizable compound having at least one of a fluorine atom or a silicon atom,
(B) a photopolymerizable initiator, and
(C) a silane coupling agent having a (meth)acryloxy group, wherein:
the (meth)acrylate compound (A1) is contained in an amount of 1 to 5% by mass of the total of all the polymerizable compounds in the composition,
the polymerizable compound (A2) is contained in an amount of 80 to 95% by mass of the total of all the polymerizable compounds in the composition, and
the (C) silane coupling agent is contained in an amount of 3 to 10% by mass of the total of all the polymerizable compounds in the composition.

* * * * *